(12) United States Patent
Akedo et al.

(10) Patent No.: US 8,398,227 B2
(45) Date of Patent: Mar. 19, 2013

(54) PATTERN DRAWING METHOD AND PATTERN DRAWING APPARATUS

(75) Inventors: Jun Akedo, Tsukuba (JP); Akito Endo, Tsukuba (JP)

(73) Assignee: National Institute of Advanced Industrial Science and Technology, Tokyo (JP)

(*) Notice: Subject to any disclaimer, the term of this patent is extended or adjusted under 35 U.S.C. 154(b) by 235 days.

(21) Appl. No.: 12/745,295

(22) PCT Filed: Dec. 5, 2008

(86) PCT No.: PCT/JP2008/072151
§ 371 (c)(1),
(2), (4) Date: May 28, 2010

(87) PCT Pub. No.: WO2009/072603
PCT Pub. Date: Jun. 11, 2009

(65) Prior Publication Data
US 2010/0302319 A1    Dec. 2, 2010

(30) Foreign Application Priority Data

Dec. 6, 2007  (JP) ................................. 2007-316154
Jul. 29, 2008  (JP) ................................. 2008-195512

(51) Int. Cl.
*B41J 2/01*    (2006.01)
(52) U.S. Cl. ........................................ 347/101
(58) Field of Classification Search ............... None
See application file for complete search history.

(56) References Cited

U.S. PATENT DOCUMENTS 7,434,912 B2   10/2008  Murata
2006/0170111 A1*  8/2006  Isa et al. ................ 257/775

FOREIGN PATENT DOCUMENTS

| JP | 2004165587 A | 6/2004 |
| JP | 2006239899 A | 9/2006 |
| JP | 2007042689 A | 2/2007 |
| JP | 2008085345 A | 4/2008 |

OTHER PUBLICATIONS

International Search Report dated Mar. 24, 2009 from the corresponding International Application No. PCT/JP2008/072151 filed Dec. 5, 2008.
IB Form 338 Notification together with the English translation of the International Preliminary Report on Patentability (Chapter I) (IB/373), dated Aug. 19, 2010, of the corresponding PCT Application No. PCT/JP2008/072151.

* cited by examiner

*Primary Examiner* — Jerry Rahll
(74) *Attorney, Agent, or Firm* — Young Basile

(57) ABSTRACT

Disclosed herein is a fine and thick wiring drawn at high speed in such a manner that a region on the substrate, on which region the liquid droplet is scheduled to impact, is heated beforehand, and that immediately after the impact of the liquid droplet on the substrate, the liquid droplet is promptly solidified so as thereby to suppress the spread of the liquid droplet due to the wettability of the liquid droplet to the substrate, and also to suppress the clogging of the nozzle due to the heating of the substrate. Thereby, even in the case where a liquid droplet having a larger volume than before is used, high-speed drawing of a thick and fine wiring having a line width approximately equal to the liquid droplet size is realized independently of the substrate material.

9 Claims, 11 Drawing Sheets

WIRING (WIDTH: 30 to 50 μm)

PATTERN DRAWING METHOD AND PATTERN DRAWING APPARATUS

TECHNICAL FIELD

The present invention relates to a pattern drawing method, a pattern drawing apparatus, and a wiring pattern, and relates to, for example, a thin film forming method, a device manufacturing method, an electro-optical apparatus manufacturing method, and an electronic device.

BACKGROUND ART

A highly functional component requires design and manufacturing techniques which can cope not only with the size and cost reduction of the product but also with the product diversification and the reduction in product cycle time. Also, in the MEMS technique which provides highly functional components and which is expected as a driving force of new industry, techniques for higher integration and higher functionality have been required. At the same time, in the stage of practical application, it has also become important to solve problems, such as reduction in the manufacturing cost and production time in a small amount and many kinds of products.

Further, in order to practically use such MEMS component as an actual product, unlike the case where a semiconductor chip is used, it is generally required to integrate the MEMS component into the product with high reliability without deteriorating the sensor and actuator functions of the component. It is found that the cost of the mounting technique used to implement such integration occupies a substantial part of the MEMS device cost.

Particularly, in such fields as medical care and welfare services, for a MEMS component (human device) required to adopt human interface, a robot, and an on-vehicle device, it is necessary to significantly reduce the mounting cost, and to significantly improve mounting flexibility to cope with design and specification changes and with the custom-made and add-on-made designs. Thus, a high-speed and fine patterning technique for electronic materials has become important.

However, in the case where a film, which is formed by applying etching, or the like, to a thin film that is made of a metal or non-metal material and that is masked by a photolithography process, is finely patterned, there are a number of manufacturing problems such as that the patterning process becomes complicated, that the flexibility of the pattern is also greatly limited and thereby it is difficult to form a continuous pattern in an area having a large level difference, and that, in the case where the non-metal material is finely patterned, since the etching speed is slow and the etching temperature is high, there are many manufacturing problems such that the etching gas causes damage to the substrate as well as the device structure and also causes deterioration in the durability of the mask material, and the like.

Thus, in recent years, a method has been proposed, by which, without using the etching process, a fine pattern of a metal or ceramic film is formed in such a manner that a raw material, such as metal nanoparticle ink and a metal alkoxide solution, is formed into liquid droplets by an inkjet method, that a fine pattern is formed by being directly drawn on a substrate, and that the formed fine pattern is then subjected to heat treatment, or the like. A pattern having a line width of about 1 μm has also been able to be formed by micronizing the liquid droplet.

In the case of this method, the fine pattern formed on the substrate is not crystallized or metallized before the heat treatment, and hence the functions of the pattern are not exhibited when the pattern is left as it is.

Thus, the fine pattern is subjected to the heat treatment so as to be crystallized. However, this method has problems that it is difficult to stably produce devices because, when many films are subjected to the heat treatment at once after being stacked in layers, the films shrink due to the crystallization of the films and thereby crack and exfoliation are caused, and that, in order to obtain a thick film, it is necessary to deposit the film on the same place many times and hence a thick film pattern is difficult to be formed at high speed.

In the conventional ink jet method, it is not possible to perform fine drawing because, when the liquid droplet is made to impact on the substrate, the liquid droplet is spread due to the wettability based on the surface tension of the liquid droplet on the substrate material, and due to the capillary effect based on the surface roughness of the substrate, so as to cause the line width to become several times or more of the liquid droplet diameter. In order to cope with such problems, the development directed to the fine drawing has been made generally in such a manner that various kinds of surface treatment are applied to the substrate surface so as to control the wettability and suppress the spread of the liquid droplet.

Further, a fine ink jet technique has been developed, in which fine drawing with a line width in the order of micrometers can be realized in such a manner that the size of the nozzle opening is reduced to 10 μm or less and that the volume size of discharged liquid droplets is reduced to $1/1000$ or less by using the electric field suction (see, for example, Patent Document 1). According to Patent Document 1, drawing with a line width of several micrometers can be realized in such a manner that the evaporation rate of the solution is nonlinearly increased by reducing the liquid droplet size, and that the spread of the liquid droplet is thereby reduced after the impact of the liquid droplet on the substrate.

Patent Document 1: JP 2004-165587 A

DISCLOSURE OF THE INVENTION

However, in the case where the various kinds of surface treatment are applied to the substrate surface, there are problems such as that the combination of the liquid droplet material used to perform drawing on the substrate surface with the substrate material is limited, and that the surface treatment is difficult to be applied to a non-planar substrate having a large level difference or having large recessions and projections. Further, in view of the clogging of the nozzle, there is a limitation in the selection of the surface tension and the viscosity of the liquid droplet material, although the limitation depends on the liquid droplet material to be supplied. It is found that the line width is limited to about 30 to 50 μm.

Further, since the liquid droplet size is very small in the technique described in Patent Document 1, the amount of the material supplied onto the substrate by each of the nozzles is extremely small, and hence the film thickness obtained by a single drawing process is about several tens of nanometers. Thus, in order to obtain a film thickness of several micrometers or more, the drawing process needs to be repeated several tens times or more, which results in a practical problem that it takes too much time to draw a wiring for large current power transmission and a wiring for signal transmission in a high frequency range, and hence a practical throughput cannot be obtained.

The present invention has been made in view of the above described circumstances. An object of the present invention is to provide a method which has a practical high drawing speed when being applied to various substrate materials that have various materials or shapes and that can be applied to the above-described manufacturing of electronic components, or the like, and which is capable of stably forming, by a single drawing process, a fine pattern having a thickness of 0.5 μm or more.

Thus, the present invention provides a method by which the increase in the size of the liquid droplet impacted on the substrate is suppressed without the liquid droplet being micronized by the micronization of the nozzle, or the like, and by which a fine wiring pattern and a functional film pattern that have a practical thickness as a wiring and a functional film are formed.

A first aspect according to the present invention is featured in that, in a pattern forming method which includes a drawing process for forming, by an inkjet method, a wring pattern or a functional film pattern on a substrate in such a manner that ink including metal fine particles or a metal alkoxide solution is used as a raw material solution and formed into liquid droplets, and that the liquid droplets are made to impact on the substrate, the pattern forming method further includes, before the drawing process, a preheating process for heating beforehand the impact scheduled region on the substrate, on which region the liquid droplet is made to impact.

Further, a second aspect of the present invention is featured in that in the pattern drawing method according to the first aspect, the preheating process heats the impact scheduled region on the substrate by irradiating a laser or an infrared ray onto the impact scheduled region.

Further, a third aspect of the present invention is featured by further including, in the pattern drawing method according to one of the first and second aspects, a substrate temperature measuring process which measures the temperature of the impact scheduled region on the substrate, and is featured in that the preheating process includes a preheating control process which controls, on the basis of the substrate temperature measured in the substrate temperature measuring process, the moving speed of the substrate, the liquid droplet discharge cycle, and the heating of the impact scheduled region.

That is, in the fine pattern forming method in which a raw material solution, such as metallic fine particle ink and a metal alkoxide solution, that are formed by dispersing metallic fine particles in a solvent, is formed into liquid droplets by an inkjet method so that a fine wiring pattern or a functional film pattern is formed by being directly drawn on the substrate, the substrate, on which the fine pattern is to be formed by the ink jet drawing, is locally heated beforehand by a laser or a lamp before the liquid droplet is made to impact on the substrate, and thereafter the liquid droplet is made to impact on the substrate by moving the substrate so as to make the nozzle of the ink jet head face the vicinity of the locally heated region on the substrate. The solvent component in the liquid droplet impacted on the substrate is promptly evaporated and dried due to the effect of residual heat of the locally heated substrate, and thereby the spread of the liquid droplet due to the wettability of the liquid droplet to the substrate is suppressed.

Further, the fine pattern is crystallized by controlling the heating temperature and the heating region, so that a thick and fine conductive wiring pattern or a thick functional film pattern is formed.

A fourth aspect according to the present invention is featured in that, in a pattern forming apparatus including drawing means which forms, by an inkjet method, a wring pattern or a functional film pattern on a substrate in such a manner that ink including metal fine particles or a metal alkoxide solution is used as a raw material solution and formed into liquid droplets, and that the droplets are made to impact on the substrate, the pattern forming apparatus further includes: substrate heating means that heats the impact scheduled region on the substrate, on which region the liquid droplets are made to impact; moving means that moves the substrate; substrate temperature measuring means that measures the substrate temperature of the impact scheduled region on the substrate, on which region the liquid droplet is made to impact; and preheating control means that controls, on the basis of the substrate temperature, the moving speed of the moving means, the liquid droplet discharge cycle, and the heating of the impact scheduled region.

That is, the fourth aspect of the present invention provides an apparatus configuration which embodies the method according to the first aspect, and which is featured in that, as shown in FIG. 1, a common ink jet apparatus is provided with laser light beam or infrared ray irradiation means for heating the substrate, a moving stage, and substrate temperature measuring means for measuring the substrate temperature at the liquid droplet impact position (impact scheduled region), and in that the moving speed of the stage, the liquid droplet discharge cycle and the irradiation intensity of the laser or the infrared ray are optimally controlled on the basis of the temperature measured at the liquid droplet impact position by the substrate temperature measuring means. The fourth aspect of the present invention is characterized in that, in order to perform the optimum control, the laser or infrared ray irradiation means for heating the substrate is arranged on the upstream side of the ink jet nozzle in the substrate moving direction.

Further, a fifth aspect according to the present invention is featured in that in a wiring pattern which is formed, by an inkjet method, in such a manner that ink including metal fine particles or a metal alkoxide solution is used as a raw material solution and formed into liquid droplets, and that the liquid droplets are made to impact on the substrate, the aspect ratio, which is a ratio of the wiring thickness to the line width of the wiring pattern, is 0.1 or more.

Further, a sixth aspect according to the present invention is featured in that in a wiring pattern which is formed, by an inkjet method, in such a manner that ink including metal fine particles or a metal alkoxide solution is used as a raw material solution and formed into liquid droplets, and that the liquid droplets are made to impact on the substrate, the side wall of the wiring pattern is formed to have an acute angle of 17 degrees or more, and preferably the side wall of the wiring pattern is almost vertically formed.

In the present invention, since the liquid droplet size is large, the material supply amount is sufficiently large as compared with that of the fine ink jet technique using the discharge of fine liquid droplets, and hence the deposition rate of the fine pattern is sufficiently high. Thus, when a fine wiring of several tens micrometers or less is formed, it is not necessary to particularly use a nozzle having a minute opening size and the electrostatic suction. Thus, it is possible to draw a fine pattern which is smaller than the nozzle opening diameter or the ink liquid droplet diameter, while using a nozzle having an opening size equal to or larger than 50 μm which is about the opening size of the conventional ink jet nozzle.

Thereby, it is possible to solve a problem of clogging of raw material ink in a fine nozzle, which has conventionally been a large practical problem. Thus, it is possible to realize a highly practical fine pattern drawing technique.

Further, it is possible to directly draw a highly dense and thick fine line on various substrate materials, while minimizing the influence of the combination of the substrate with the raw material ink and the influence of the wettability of the raw material ink to the substrate surface, which wettability is based on the surface roughness of the substrate.

Note that it is conceivable that the same effect can be obtained even in the case where the substrate is directly heated by a heater, or the like. However, in this case, since a large area other than the liquid droplet impact position (impact scheduled region) is heated, and since the ink jet head itself is also easily heated by the heat emitted from the substrate, the raw material ink in the nozzle of the head is dried with the lapse of time, so that the nozzle is clogged by the raw material ink in the nozzle. This results in a problem that stable ink discharge cannot be realized for a long time. Further, this results in a disadvantage that, particularly in the case where the distance between the nozzle and the substrate is reduced to several millimeters or less due to the requirement of drawing precision, and where fine liquid droplets having a diameter of 100 μm or less are discharged, the substrate temperature is difficult to be increased to 100° C. or more.

On the other hand, when the heating is performed by irradiation of the laser or the infrared ray, the space in the impact scheduled region is locally heated, and hence the thermal influence on the ink jet nozzle set close to the substrate is significantly suppressed. Thus, in the state where the raw material ink in the nozzle is not dried and where no nozzle clogging occurs, the substrate surface can be heated to a sufficiently high temperature, so that the liquid droplet discharge and the drawing can be stably continued.

DESCRIPTION OF SYMBOLS

Figure 1:
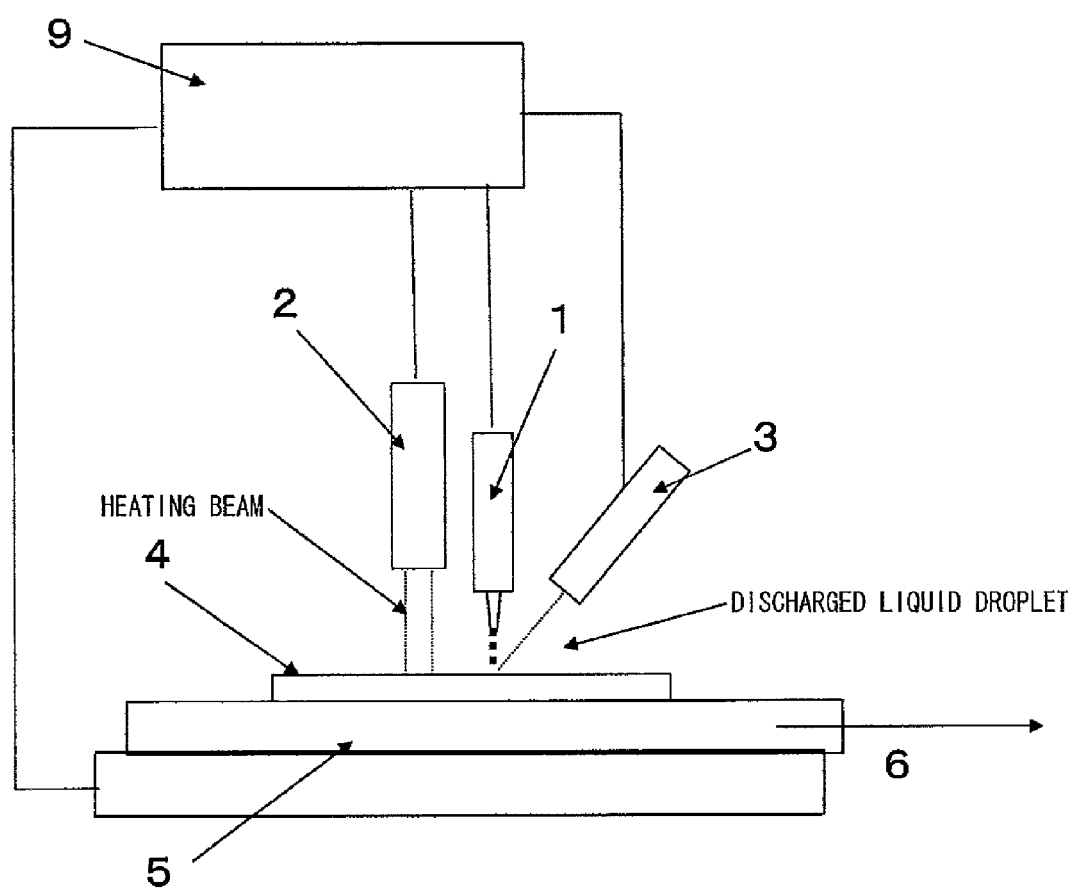
FIG. 1 is a front view showing a schematic entire configuration of a fine pattern forming apparatus which is an embodiment according to the present invention.

1. Ink jet nozzle
2. Laser or lamp beam irradiation heating apparatus
3. Substrate temperature measuring radiation thermometer
4. Substrate
5. Moving stage
6. Stage moving direction
7. Discharged liquid droplet
8. Heating beam
9. Preheating control section

BEST MODE FOR CARRYING OUT THE INVENTION

In the present invention, to form a thick fine pattern, when the liquid droplet diameter is too small, the material supply amount itself is reduced, and hence the drawing needs to be repeated at the same place to obtain a thick fine pattern. However, when the liquid droplet diameter is set in the range of 10 μm to 150 μm, more preferably in the range of 50 μm to 100 μm, a fine pattern having a thickness of 0.5 μm or more and having a line shape can be formed without repetition of the drawing.

Further, when the heating temperature of the substrate by the laser irradiation or the lamp heating is too high, a boiling phenomenon is caused due to local unevenness in the heating of the liquid droplets impacted on the substrate, so that a delicate and smooth fine pattern surface cannot be obtained. Further, when the heating temperature of the substrate is too low, the drying effect is insufficient, so that the liquid droplet spreads. The boiling phenomenon and the insufficient drying effect depend on the size of liquid droplet at the time when the liquid droplet impacts on the substrate. However, as a result of extensive study of the present inventors, it was found that, in the liquid droplet diameter range of 10 to 150 μm, more preferably in the liquid droplet diameter range of 50 to 100 μm, a substrate surface temperature in the range of 50 to 200° C. is preferred as the temperature at the liquid droplet impact position (impact scheduled region), at which temperature the evaporation of an organic solvent is accelerated and at which temperature the boiling phenomenon does not occur, and in this way a fine pattern having no spot and having a smooth surface can be formed.

Here, the impact scheduled region is a position on the substrate, at which position a liquid droplet is scheduled to impact after lapse of a predetermined time period. The scheduled impact region is determined on the basis of drawing information. The drawing information is information obtained by combining pattern information relating to a pattern to be drawn on the substrate, with time information representing the drawing timing assigned to the pattern information. The drawing information is created by drawing means, a host computer (not shown), or the like. That is, the drawing information includes information representing at what time and at what coordinate position on the substrate the liquid droplet is discharged. Thus, the position on the substrate, at which position the liquid droplet is scheduled to impact at the predetermined time, can be specified on the basis of the moving direction and speed of the substrate. Therefore, the impact scheduled region is specified on the basis of the position on the substrate at which position the liquid droplet is scheduled to impact at the predetermined time, and on the basis of the moving direction and speed of the substrate.

Further, it is not practical to directly heat only the impacted liquid droplet by laser irradiation or the lamp heating. This is because, since the liquid droplet size is as small as 100 μm or less, high positioning precision is required and hence the drawing becomes unstable due to external vibration, and the like. Further, since high precision is also required for the irradiation energy, it is not practical to directly heat only the impacted liquid droplets. For this reason, the spot diameter of the light beam, which is irradiated for heating by the laser irradiation or the lamp heating, is set in the range of 50 μm to 10 mm, more preferably in the range of 500 μm to 5 mm. At this time, when the laser or the lamp beam is irradiated from the side of the substrate surface, on which side the ink is made to impact, the thermal damage to the substrate is suppressed to minimum regardless of the thickness and material of the substrate, and thereby the drawing can be stably performed.

Further, in the case where the timing and the heating position of locally heating the substrate are set so that the substrate is heated simultaneously with or before the impact of the liquid droplet on the substrate, significantly high irradiation power for heating is required in order to heat the liquid droplet impacted on the substrate to a temperature that is sufficient for the liquid droplet to be dried before the liquid droplet is spread due to the wettability of the liquid droplet to the substrate. For this reason, the air between the nozzle and the substrate is locally heated instantaneously. The air flow caused by the instantaneous heating makes it difficult for the subsequent liquid droplets to be precisely impacted on the substrate. As a result, it becomes difficult to precisely draw a fine pattern.

Thus, in the case where, as shown in FIG. 1, a laser irradiation apparatus or a lamp heating apparatus (substrate heating means) is arranged at a position which is located on the upstream side of an ink liquid droplet impact position on a substrate that is moved relative to an ink jet head, and which is separated from the substrate. In addition, the moving speed of a moving stage (moving means) that moves the substrate and the irradiation intensity of the laser or the lamp beam are adjusted in association with each other, and the size of the irradiation spot and the irradiation position that are heated by the laser irradiation apparatus or the lamp heating apparatus, and the impact position of the liquid droplet are adjusted in association with each other. Thus the substrate heating temperature can be easily adjusted to an optimum substrate heating temperature before the impact of the ink liquid droplet on the substrate.

Further, the above described arrangement has an advantage that, even in the case of a liquid droplet discharge head or a multi nozzle head (structure in which a plurality of nozzles are arranged in an array state) which has an ink liquid droplet size of 50 μm or less, in the vicinity of which the laser irradiation apparatus or the lamp heating apparatus is physically difficult to be arranged, and in which the distance between the nozzle and the substrate needs to be significantly reduced, a similar heating effect can be easily provided to the substrate at the impact position of the ink liquid droplet.

Further, at this time, by optimizing the weight fraction of a material such as Ag ultrafine particle in the ink depending on the ink liquid droplet, the ink can be dried and sintered in a short time, so as to minimize the substrate heating temperature. Therefore, the thermal damage to the substrate can be suppressed to minimum.

Hereinafter, an embodiment according to the present invention will be described with reference to FIGS. 1 to 3.

FIG. 1 is a view showing a schematic entire configuration of a fine pattern forming apparatus which is an embodiment according to the present invention.

A fine pattern drawing apparatus according to the present invention is constituted by including, as shown in FIG. 1, an ink jet nozzle 1, a laser irradiation or lamp beam irradiation heating apparatus 2, a substrate temperature measuring radiation thermometer 3, a substrate 4, a moving stage 5, and a preheating control section 9 which controls the stage moving speed and the heating temperature, and is characterized in that the laser irradiation or lamp beam irradiation heating apparatus 2 for heating the substrate is arranged on the upstream side of the ink jet nozzle 1 to the substrate moving direction.

The substrate temperature measuring radiation thermometer 3 functions as substrate temperature measuring means. When the measurement point of the substrate surface temperature is close to the ink liquid droplet impact point on the substrate, the substrate temperature measuring radiation thermometer 3 may measure the temperature from any direction.

In the drawing process, in the state where the liquid droplet is not discharged from the ink jet nozzle 1, the substrate 4 is first heated by the laser irradiation or lamp beam irradiation heating apparatus 2 in a non-contact manner. Next, the temperature of the heated substrate surface is measured by the substrate temperature measuring radiation thermometer 3 (substrate temperature measuring process). It is preferred that the measurement point at this time is set as close as possible to the liquid droplet impact position on the substrate.

Next, while the moving stage 5 is reciprocated in association with the ink discharge cycle at a speed at which a continuous fine pattern can be formed, the power of heating irradiation of the laser irradiation or lamp beam irradiation heating apparatus 2 is adjusted by the preheating control section 9 so that the measured temperature becomes a temperature suitable for drying the liquid droplet impacted on the substrate 4 (preheating control process). The preheating control section 9 functions as preheating control means.

When the above described setting is completed, then while the substrate 4 is moved from the side of the laser irradiation or lamp beam irradiation heating apparatus 2 toward the ink jet nozzle 1 (stage moving direction 6), a fine pattern is drawn by discharging raw material ink from the ink jet nozzle 1.

The raw material ink used in the present invention may be constituted such that fine particles having a particle diameter of 1 μm or less are dispersed in an organic solvent, and is constituted by containing one of the metals of gold, silver, copper, platinum, palladium, tungsten, nickel, tantalum, bismuth, lead, indium, tin, zinc, titanium, and aluminum, or by containing an oxide of one of the metals or an alloy made of two or more of the metals.

Figure 2:
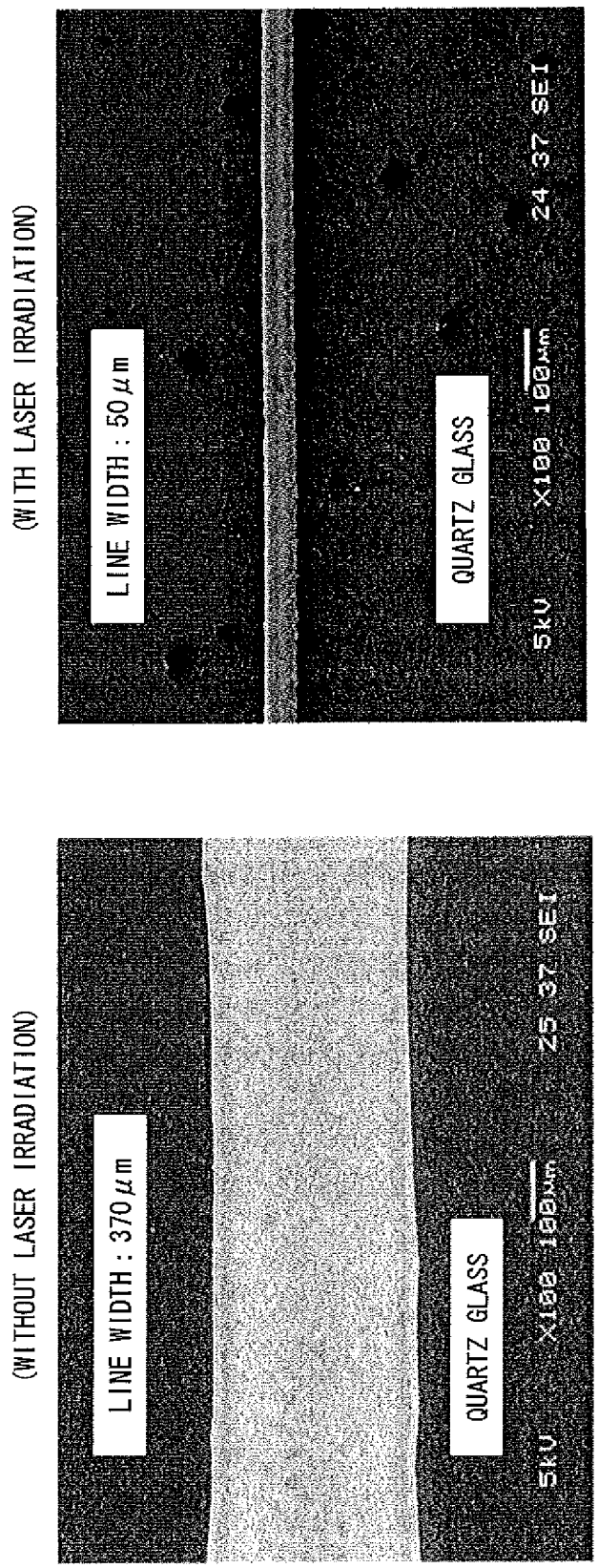
FIG. 2 is a photograph showing an effect of reducing the width of wiring formed by ink jet drawing based on laser irradiation heating according to the present invention.

FIG. 2 shows an effect of reducing the width of wiring formed by the ink jet drawing based on the laser irradiation heating according to the present invention. Ag nanoparticle ink (produced by Harima Chemicals, Inc, Ag particle diameter: 6 to 10 nm, main solvent: n-tetradecane, and Ag-particulate weight fraction: 20 to 60 wt %) was used as the raw material ink, and a quartz glass substrate was used as the substrate. Further, a $CO_2$ laser was used as the irradiation source for heating, so that the fine pattern was drawn by making the ink discharged at a frequency of 100 Hz to 50 kHz from an ink jet head having a nozzle opening of 100 μm.

The moving speed of the moving stage 4 at this time was set in the range of 1 mm/sec to 100 mm/sec, and the distance between the ink jet nozzle 1 or the ink liquid droplet impact position on the substrate and the center of the portion on the substrate, which portion is heated by the laser irradiation or lamp beam irradiation heating apparatus 2, was set in the range of 0.05 mm to 50 mm. Further, from a result of an experiment performed by using a flash light source synchronized with the ink discharge, it was confirmed that the diameter of the discharged liquid droplet is about 50 µm.

As a result, as shown in FIG. 2, in the case of the common ink jet drawing without using the laser irradiation, the line width of the Ag wiring was spread in a far wider range up to 370 µm as compared with the discharged liquid droplet diameter, and the line width was also unstable. On the other hand, in the case where the substrate was heated by the laser irradiation, an uninterrupted and continuous fine Ag wiring pattern in a line shape was obtained, and the line width of the wiring pattern was fixed and reduced to a value of 58 µm which is approximately equal to the diameter of the discharged ink liquid droplet and which is about ⅙ of the line width obtained in the case without using the laser irradiation.

Figure 3:
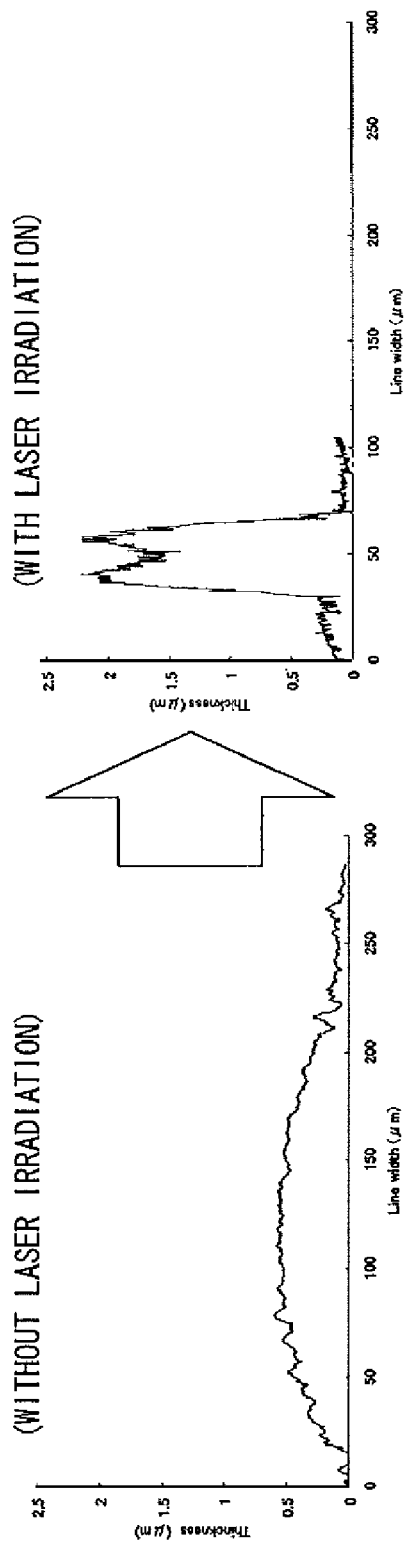
FIG. 3 is a view showing a cross sectional shape of the wiring pattern formed by the ink jet drawing based on the laser irradiation heating and shown in FIG. 2.

FIG. 3 shows a difference between the cross sectional shape of the Ag wiring pattern formed by using the laser irradiation and the cross sectional shape of the Ag wiring pattern formed without using the laser irradiation. The cross sectional shape was measured by a laser microscope. In the case where the laser irradiation is performed, the wiring thickness is increased to about four times thicker than that in the case where the laser irradiation is not performed. Further, in the case where the laser irradiation is performed, the inclination angle of the side wall of the drawn wiring is also formed at an angle of about 17 degrees, which is acuter than the angle obtained in the case where the laser irradiation is not performed, so that the edge portion also becomes sharp. Therefore, as compared with the case where the laser irradiation is not performed, the wiring can be formed to have a side wall inclination angle of 17 degrees or more in the case where the laser irradiation is performed. As a result, a fine wiring pattern having a thin line width can be formed. At the same time, a wiring pattern, which has a thickness increased by the amount corresponding to the reduced amount of the line width, can be obtained. This results in an effect that a wiring pattern having a sufficient thickness can be formed even in a single layer constitution. As described above, it was confirmed that the present invention has practical effects.

Further, in the wiring pattern shown in FIG. 3, the aspect ratio, which is a ratio of the wiring thickness to the line width of the wiring pattern (wiring thickness/line width), is about 0.002 in the case where the laser irradiation is not performed, while the aspect ratio is about 0.037 in the case where the laser irradiation is performed. The ink containing the metallic fine particles or the metal alkoxide solution according to the present invention has a lower volume resistivity than the conventional bulk material, and hence the aspect ratio is preferably set to 0.1 or more to form a wiring pattern having practically applicable conductor resistance.

Figure 4:
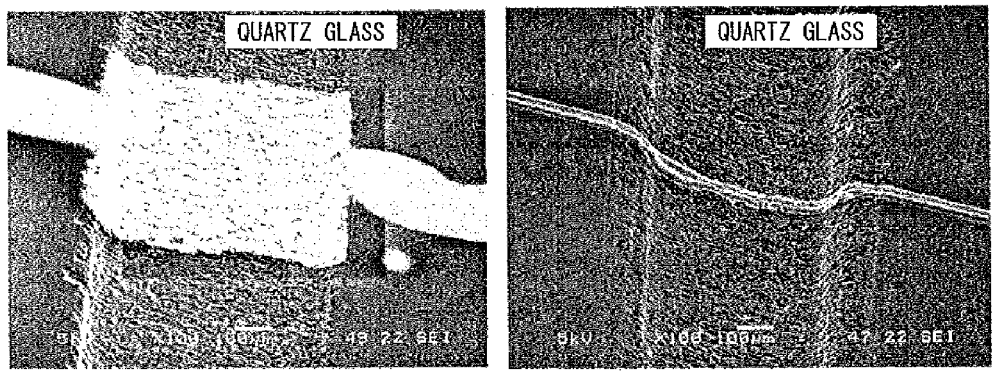
FIG. 4 is a photograph showing a silver fine particle wiring pattern which has a line width of 50 μm and which is drawn by a fine pattern drawing apparatus according to the present invention and by getting over a level difference groove of 100 μm formed on a glass substrate.

FIG. 4 shows a result obtained in such a manner that, on a quartz glass substrate, on which a groove having a level difference of 100 µm and a width of 500 µm is formed, a wiring pattern is formed under the same conditions so as to get over the groove. The groove is formed by grinding work, and hence the surface of the groove is more greatly roughened than the portion which is not subjected to the grinding work.

As a result, in the case where the laser irradiation was not performed, in the roughened surface portion and the level difference edge portion of the groove, the impacted liquid droplet was widely spread due to the capillary force so as to significantly increase the line width, and hence the electrical conduction could not secured. On the other hand, in the case where the laser irradiation was performed, the drawing could be performed with the same line width including the portions within and outside the groove, and the line width could also be significantly reduced to about 60 µm.

Further, the laser irradiation effect according to the present invention makes it possible to form a fine pattern film, such as a metal wiring, on a substrate having fine recessions and projections without the spread of liquid droplet. Thus, the close contact force between the fine pattern film and the substrate, which has conventionally been a problem in the ink jet wiring, and the like, that is, the adhesion intensity between the fine pattern film and the substrate, can be drastically improved by the anchoring effect between the recessions and projections on the substrate surface and the fine pattern film formed on the substrate surface.

Figure 5:
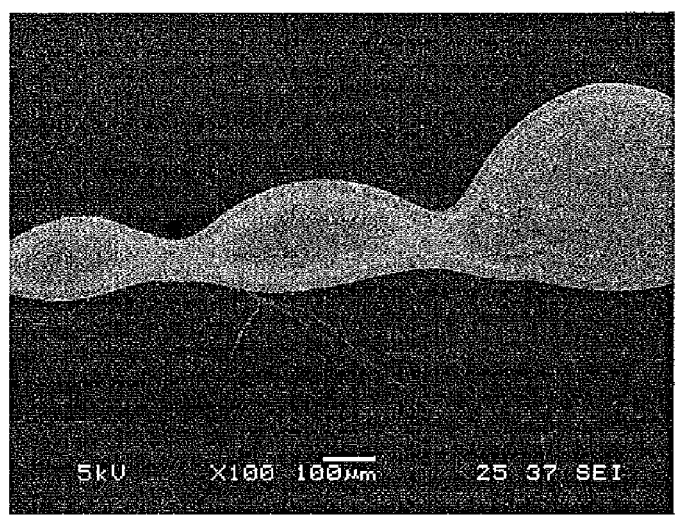
FIG. 5 is an SEM image showing a pattern drawn (at a low laser power level) at the time when a laser irradiation position is made to coincide with an ink impact position.
Figure 6:
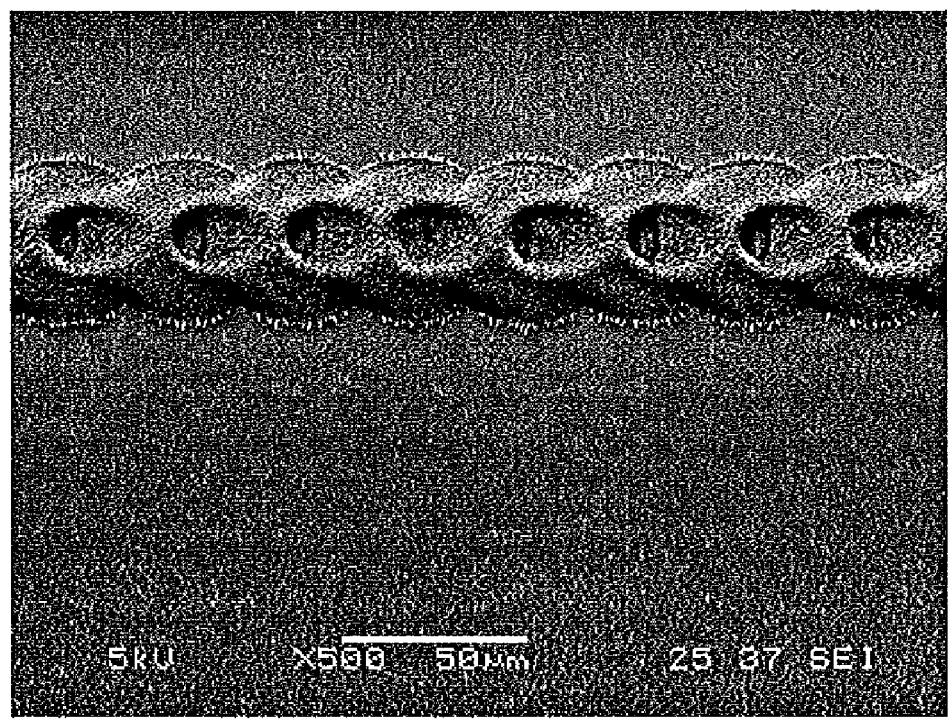
FIG. 6 is an SEM image showing a pattern drawn (at a high laser power level) at the time when the laser irradiation position is made to coincide with the ink impact position.

FIG. 5 and FIG. 6 show results of wiring drawing in the case where the laser irradiation portion on the moving substrate according to the present invention is made to coincide with the ink jet liquid droplet impact position on the substrate. FIG. 5 shows a case where the laser irradiation position is made to coincide with the liquid droplet impact position under the drawing conditions shown in FIGS. 1 to 3. In this case, since the substrate is being moved, the heating by the laser irradiation is not sufficient under the drawing conditions shown in FIGS. 1 to 3. As a result, the liquid droplet is not sufficiently dried and solidified, and thereby the drawing line width is not reduced and becomes unstable. FIG. 6 shows a case where conditions, under which the drawn line width is reduced by the laser irradiation effect, are obtained by increasing laser power to compensate the insufficient laser power and by reducing the stage moving speed. However, although the reduction effect of the wiring width can be recognized, fine holes, and recessions and projections, which are considered to be caused by the bumping phenomenon of ink, can be recognized in the wiring pattern itself, and hence a fine wiring cannot be smoothly drawn.

Thereby, it was proved that when the laser irradiation apparatus or the lamp heating apparatus is arranged at the position which is located on the upstream side of the ink jet head that is moved relative to the substrate and which is separated from the substrate, and when the moving speed of the moving stage that moves the substrate, and the irradiation intensity of the laser or the lamp beam are adjusted in association with each other, the temperature of the substrate heating temperature can be easily adjusted to an optimum substrate heating temperature before the impact of the liquid droplet on the substrate, so that the nozzle clogging and the thermal damage to the substrate can be suppressed to the minimum, and so that a practical process margin can be obtained at a high stage moving speed.

Figure 7:
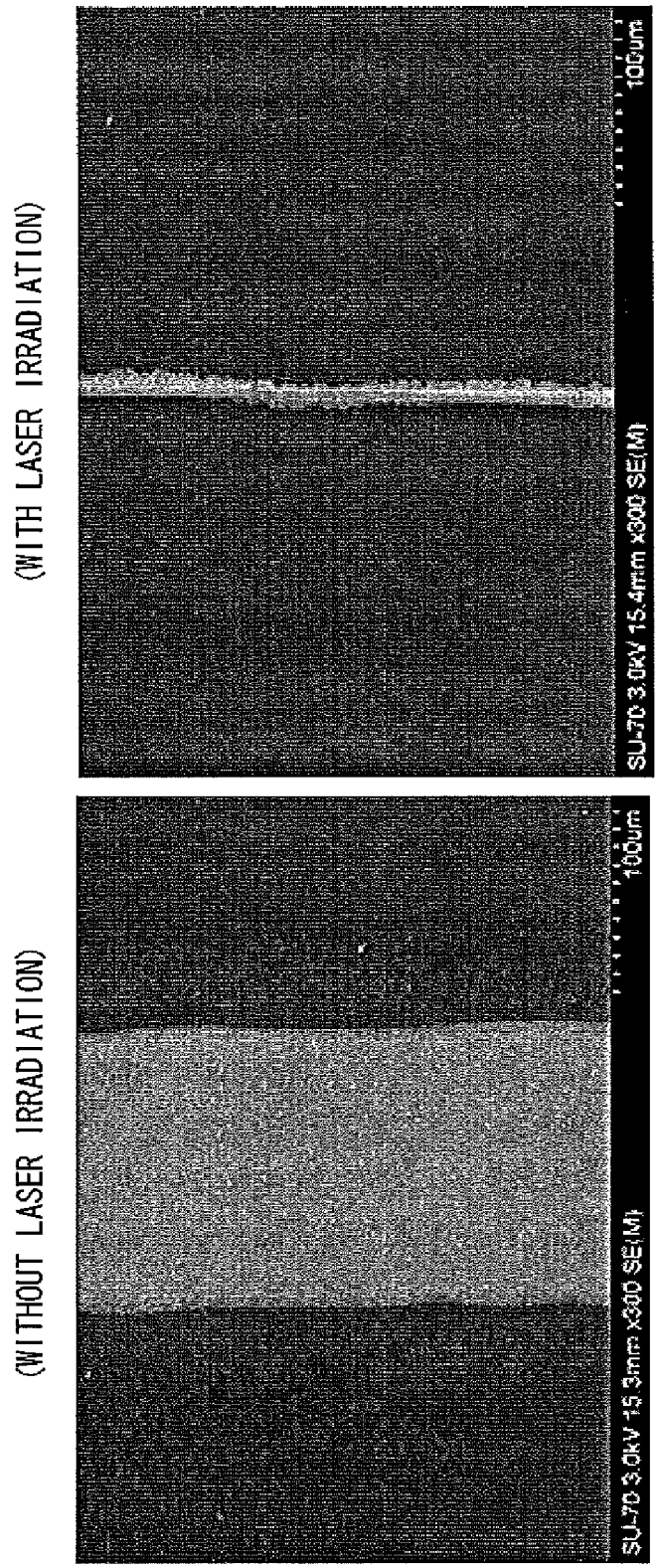
FIG. 7 is an SEM image showing an Ag wiring drawn according to the present invention.

FIG. 7 shows a reducing effect of the width of wiring which is formed by the ink jet drawing method using the laser irradiation heating according to the present invention, in the case where the liquid droplet size is reduced to be smaller than the size in the above described embodiment. The Ag nanoparticle ink (produced by Harima Chemicals, Inc, Ag particle diameter: 6 to 10 nm, main solvent: n-tetradecane, and Ag-particulate weight fraction: 60 to 80 wt %) was used as the raw material ink, and a quartz glass substrate was used as the substrate. Further, a $CO_2$ laser was used as the radiation source for heating, and thus the fine pattern was drawn by making the ink discharged at a frequency of 1 kHz to 50 kHz from an ink jet head.

The moving speed of the moving stage 4 at this time was set in the range of 10 mm/sec to 100 mm/sec, and the distance between the ink jet nozzle 1 or the ink liquid droplet impact position on the substrate and the center of the portion on the substrate, which portion is heated by the laser irradiation heating apparatus 2 using the $CO_2$ laser as the laser source, was set in the range of 0.5 mm to 50 mm. Further, from a result of an experiment performed by using a flash light source synchronized with the ink liquid droplet discharge, it was confirmed that the diameter of the discharged liquid droplet is about 20 to 25 μm (4 to 8 pL) and is approximately equal to the diameter of the discharged liquid droplet of a common inkjet printer for home use.

As a result, as shown in FIG. 7, in the case of the common ink jet drawing and in the case without using the laser irradiation, the line width of the Ag wiring was spread to an extremely larger width of 155 μm than the discharged liquid droplet diameter, and the line width was also unstable. On the other hand, in the case where the substrate was heated by the laser irradiation, an uninterrupted and continuous fine Ag wiring pattern in a line shape was obtained, and the line width of the wiring pattern was fixed and reduced to the order of 7 to 10 μm which is smaller than the diameter of the discharged ink liquid droplet and which is about 1/15 to 1/22 of the line width obtained in the case without using the laser irradiation.

Figure 8A:
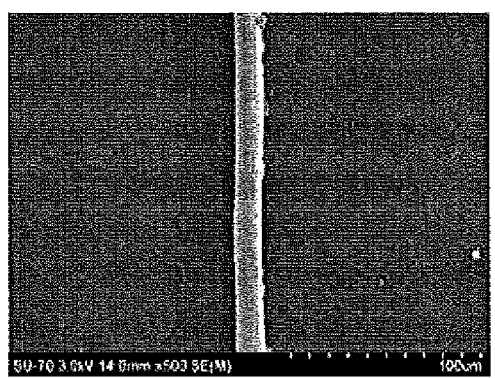
FIG. 8 is an SEM image showing a cross section of the Ag wiring drawn according to the present invention.
Figure 8B:
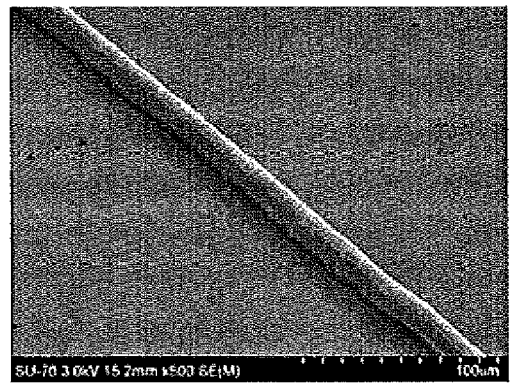
Figure 8C:
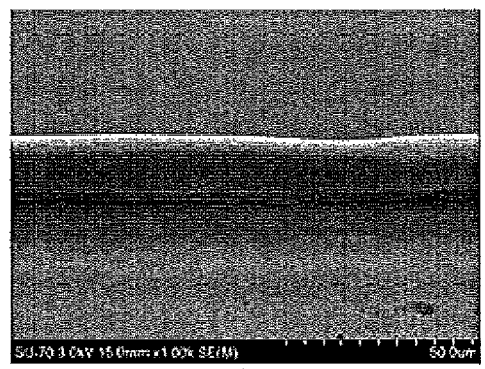
Figure 9A:
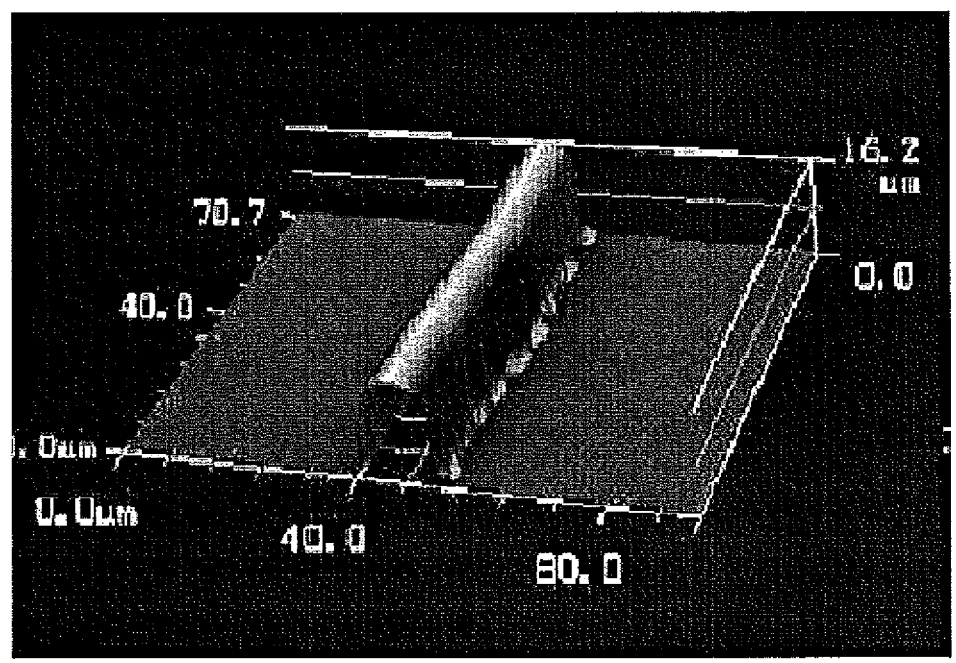
FIG. 9 is a view showing a cross sectional shape of the Ag wiring measured by a laser microscope.
Figure 9B:
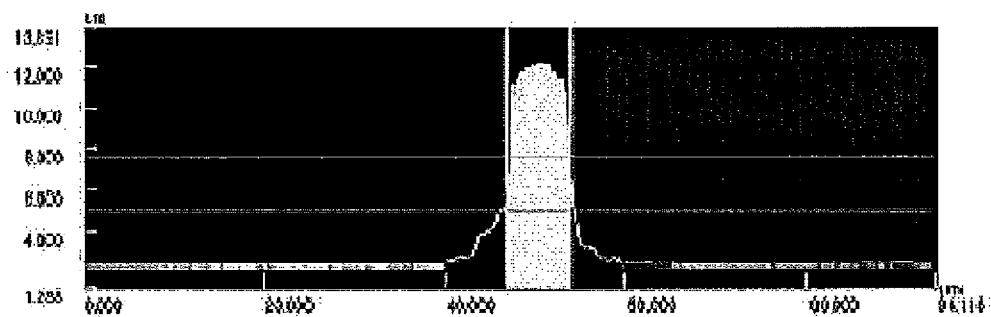

FIG. 8 shows an SEM image of Ag wiring patterns which are formed in the case where the laser irradiation is performed and in the case where the laser irradiation is not performed. FIG. 9 is a view showing cross sectional shapes of the Ag wiring patterns which are formed in the case where the laser irradiation is performed and in the case where the laser irradiation is not performed. FIG. 8 and FIG. 9 both show the observation images of the same sample. The precise cross sectional shape was measured by the laser microscope. It can be seen from the figures that a fine wiring having a three-dimensional thickness can be formed. When the laser irradiation is performed, while an ink jet head equal to an expensive inkjet printer for home use is used, a fine wiring pattern, which has a line width of 10 μm or less and a wiring thickness is 10 μm or more without being overwritten by the single nozzle, and which has an aspect ratio that is a ratio of the wiring thickness to the line width (wiring thickness/line width) and that is as large as 1 or more, can be obtained. Further the drawing speed is 10 mm/sec or higher, so that high-speed drawing can be performed. Further, the angle of the side wall of the drawn wiring is almost vertical, and hence it is clearly seen that an acute angle is formed as compared with the case without using the laser irradiation. From the above, it was confirmed that the present invention has practical effects.

Further, when the laser power is adjusted at this time, an electrical resistance value, which is practically applicable as a value of a wiring conductor, and which is in the order of a $10^{-6}$ Ω·cm, can be obtained without performing the heat treatment after the drawing.

Figure 10:
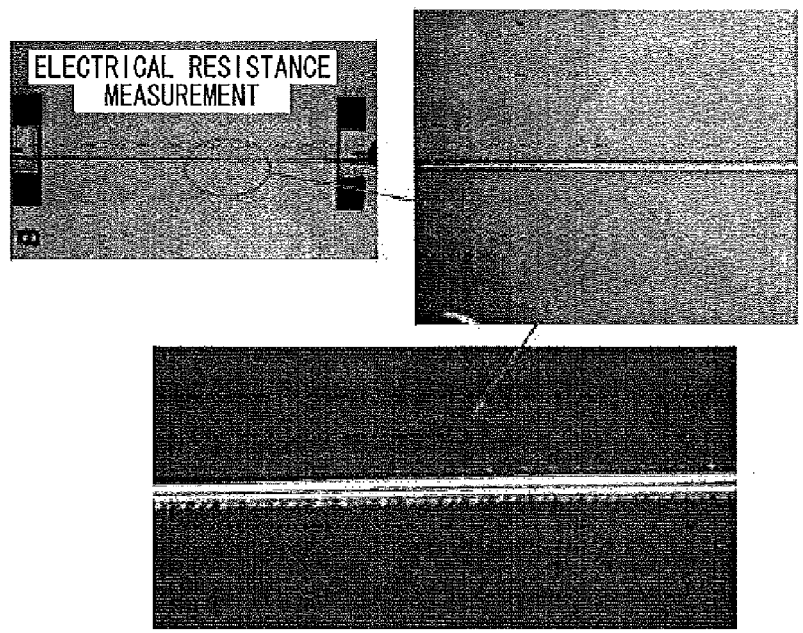
FIG. 10 is a view showing a method for measuring the electrical resistance of the Ag wiring drawn according to the present invention.
Figure 11:
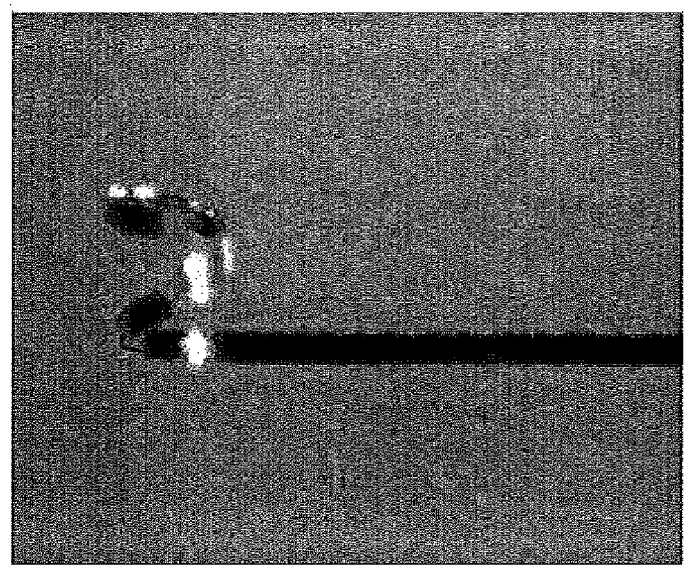
FIG. 11 is a photograph taken at the time when the Ag wiring drawn according to the present invention is peeled off by a cutter.

FIG. 10 shows a state of an Ag fine wiring simultaneously drawn and heat-treated according to the present invention. At this time, in the fine wiring, the DC resistance value in the length of 10 mm was 6.27Ω, the line width was about 30 to 50 μm, and the thickness was about 5 μm. Thus, the volume resistivity of the fine wiring was $3\times10^{-6}$ Ω·cm. FIG. 11 shows a state where the fine wiring is forcibly peeled off from the glass substrate by using a cutter. It can be seen from the figure that the wiring emits metallic luster, that the wiring is formed into a curled shape and hence has metal elasticity, and that the Ag ultrafine particle is sufficiently sintered. However, the above described laser irradiation conditions, under which the wiring line width can be made fine and under which the wiring thickness can be increased, may not match the conditions required for some of target substrate materials and functional materials other than Ag ink. In such case, a laser irradiation heating apparatus for heat-treating the wiring may be separately provided. Alternatively, it may also be configured such that the optical path from the laser irradiation heating apparatus 2 for heating the discharged ink liquid droplet or for heating the substrate is branched by a mirror, or the like, and such that immediately after the fine pattern drawing is performed, the heat treatment of the wiring is performed by irradiating a laser of higher power onto the wiring.

Figure 12:
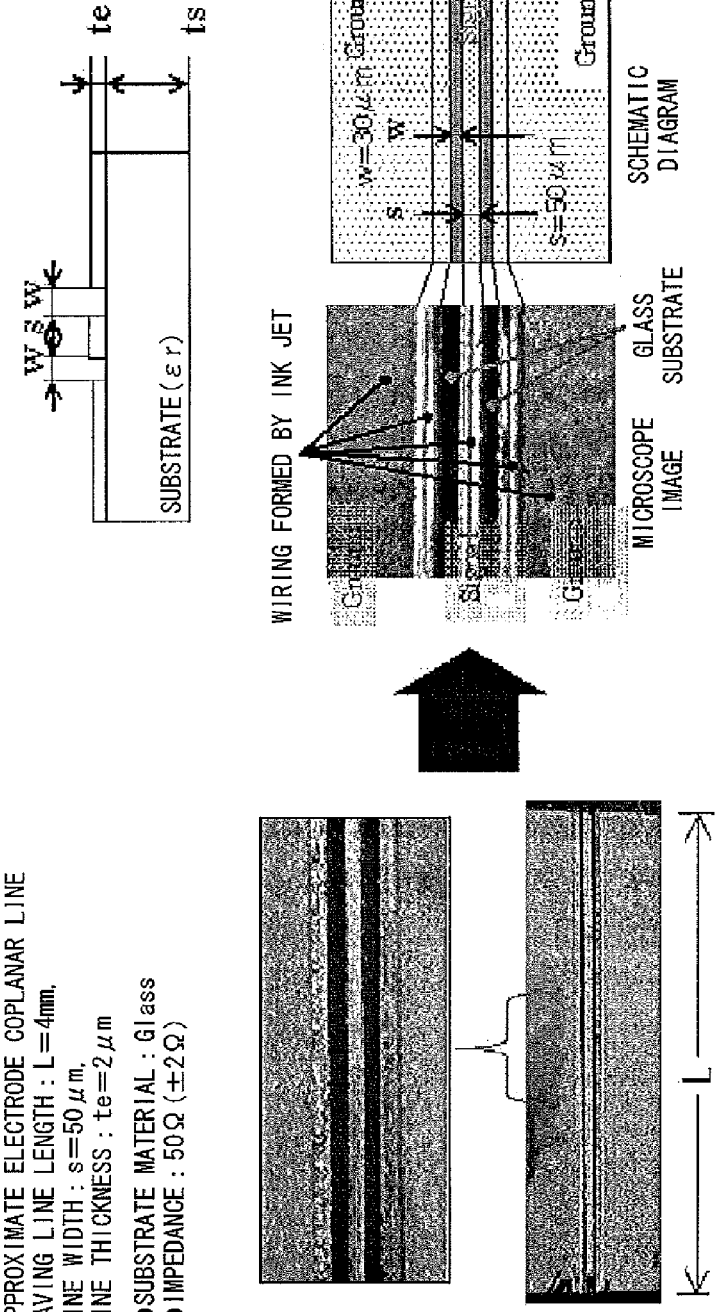
FIG. 12 is a view showing a method for forming transmission characteristics in a coplanar transmission line (having a line width of 50 μm) according to the present invention.
Figure 13:
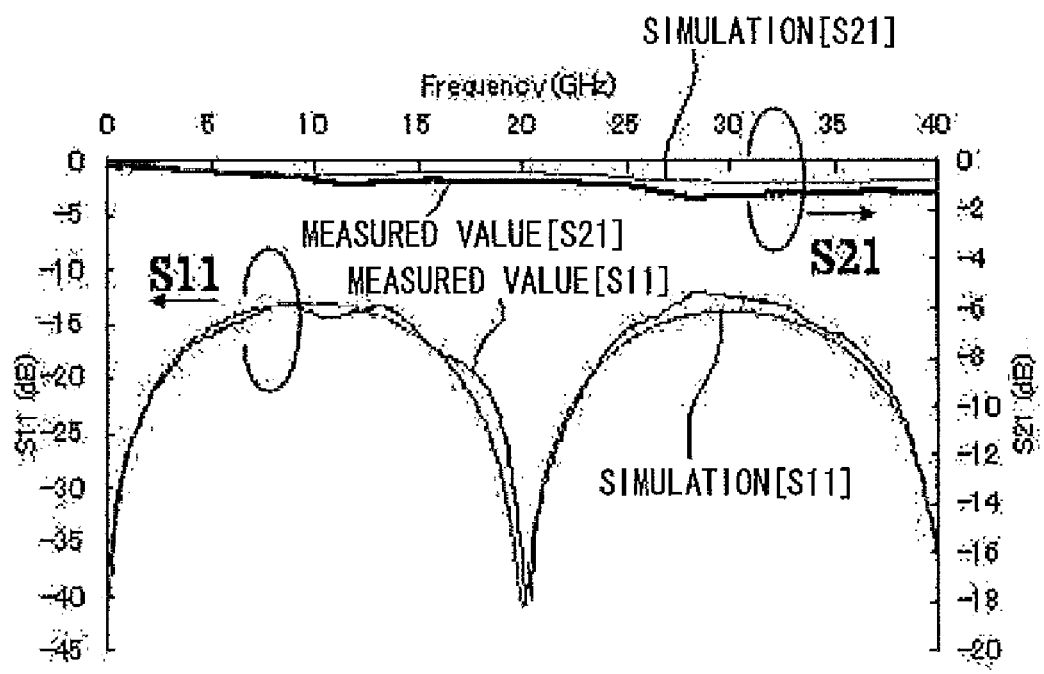
FIG. 13 is a view showing a comparison between actually measured values and simulation results of the transmission characteristics of the coplanar transmission line (having the line width of 50 μm).

FIG. 12 shows results obtained at the time when a coplanar type high frequency transmission line is formed by utilizing the excellent electrical properties of the Ag fine wiring according to the present invention. Specifically, an overview of the drawn transmission line is shown in the lower left portion in FIG. 12, and a magnified image of the transmission line is shown in the portion above the lower left portion. A further magnified image of the transmission line and a schematic diagram of the drawing procedure of the transmission line are shown in the right portion in FIG. 12. In the drawing method of the transmission line, three parallel Ag wirings having a line width of 50 μm are first drawn by the laser irradiation according to the present invention. Next, the portion serving as the ground plane is drawn without using the laser irradiation. In this way, according to the present invention, an Ag pattern having a large area and a wiring pattern having different line widths can be efficiently drawn by using the same ink jet head in such a manner that the laser irradiation is turned on and off and that the laser irradiation power is controlled. FIG. 13 shows transmission characteristics of the coplanar type high frequency transmission line which has a line length of 4 mm and which is drawn as described above. Reference character S21 denotes the reflection characteristic of the transmission line. The width of the transmission line is 50 μm, and the transmission line gap is 40 μm. As compared with the results of simulation by theoretical calculation, it was confirmed that the value of S21, which is defined as S21=20 $\log_{10}$ (transmitted amount/incident amount) to represent a signal power gain (attenuation characteristic) in the frequency band up to 40 GHz, is −1.5 dB or more (which means that 84% or more of the input signal is transmitted, and meanwhile, the transmission characteristic of a bulk material is such that S21 is −1 dB and the transmittance is about 90%). Thus, it was confirmed that the transmission line has practical applicability.

The invention claimed is:

1. A pattern drawing method for forming a pattern comprising:
   preheating an impact scheduled region on a substrate on which the pattern is to be formed by using a heating apparatus that is arranged at a position located on an upstream side of an ink jet head which is moved relative to the substrate and which is separated from the substrate;
   forming liquid droplets, by an inkjet method, of a raw material comprising ink and metallic particles, and making the droplets impact on the substrate;
   wherein the heating apparatus is arranged at the position located on the upstream side of the ink jet head so that the substrate is preheated before the droplets are impacted on the substrate, and a distance between a distance between an inkjet liquid droplet impact scheduled position on the substrate and a center position on the substrate, which center position is heated by heating apparatus, is set in a range of 0.5 mm to 50 mm, and a surface temperature at the inkjet liquid droplet impact scheduled position is in a range of 50 to 200° C.

2. The pattern drawing method according to claim 1, wherein the preheating the impact scheduled region on the substrate comprises irradiating a laser or an infrared ray onto the impact scheduled region.

3. The pattern drawing method according to claim 1, further comprising:
   measuring with a substrate temperature measuring process a temperature of the impact scheduled region on the substrate; and
   controlling with a preheating control process a moving speed of the substrate, a discharge cycle of the liquid droplets, and the heating of the impact scheduled region on the basis of the substrate temperature measured in the substrate temperature measuring process.

4. The pattern drawing method according to claim 1, wherein the metallic particles are in a metal alkoxide solution.

5. A wiring pattern formed by the pattern drawing method of claim 1, wherein the wiring pattern has an aspect ratio of 0.1 or more, the aspect ratio a ratio of wiring thickness to line width of the wiring pattern.

6. A wiring pattern formed by the pattern drawing method of claim 1, wherein an angle of a side wall of the wiring pattern is an acute angle of 17 degrees or more.

7. The pattern drawing method according to claim 1, wherein the pattern is a wiring pattern or a functional film pattern.

8. A pattern drawing apparatus for forming, by an inkjet method, a wiring pattern or a functional film pattern on a substrate with ink including metal fine particles or a metal alkoxide solution formed into liquid droplets that impact the substrate, the pattern drawing apparatus comprising:
   substrate heating means for heating an impact scheduled region on the substrate where the liquid droplets will impact;
   moving means for moving the substrate;
   substrate temperature measuring means for measuring a substrate temperature in the impact scheduled region on the substrate; and
   preheating control means for controlling, on the basis of the substrate temperature, a moving speed of the moving means, a discharge cycle of the liquid droplets, and the heating of the impact scheduled region, wherein the substrate heating means is arranged at a position that is located on an upstream side of an ink jet head which is moved relative to the substrate and which is separated from the substrate, a distance between the impact scheduled region on the substrate and a center position on the substrate is set in a range of 0.5 mm to 50 mm, and a surface temperature at the impact scheduled region is in a range of 50 to 200° C.

9. pattern drawing method for forming a pattern comprising:
   arranging a heating apparatus at a position that is located on an upstream side of an ink jet head to a substrate moving direction, and forming an impact scheduled region of the substrate by heating using the heating apparatus; and
   forming liquid droplets, by an inkjet method, of a raw material comprising ink and metallic particles, and making the liquid droplets impact on the substrate;
   wherein the impact scheduled region is a region of the substrate that is preheated before the liquid droplets from the ink jet head are impacted on the substrate, and a distance between an ink jet liquid droplet impact scheduled position on the substrate and a center position on the substrate, which center position is heated by the heating apparatus, is set in the range of 0.5 mm to 50 mm and the surface temperature at a liquid droplet impact scheduled region is in the range of 50 to 200° C.

* * * * *